(12) United States Patent
Lee (10) Patent No.: US 12,438,256 B2
(45) Date of Patent: Oct. 7, 2025

(54) ELECTRONIC DEVICE AND ANTENNA ASSEMBLY

(71) Applicant: Getac Holdings Corporation, Taoyuan (TW)

(72) Inventor: Kun-Cheng Lee, Taipei (TW)

(73) Assignee: Getac Holdings Corporation, Taoyuan (TW)

( * ) Notice: Subject to any disclaimer, the term of this patent is extended or adjusted under 35 U.S.C. 154(b) by 0 days.

(21) Appl. No.: 18/742,632

(22) Filed: Jun. 13, 2024

(65) Prior Publication Data

US 2024/0332784 A1  Oct. 3, 2024

Related U.S. Application Data

(63) Continuation of application No. 17/357,476, filed on Jun. 24, 2021, now Pat. No. 12,040,532.

(60) Provisional application No. 63/044,206, filed on Jun. 25, 2020.

(30) Foreign Application Priority Data

Nov. 13, 2020  (CN) .......................... 202011268948.7

(51) Int. Cl.
*H01Q 1/24* (2006.01)
*H01Q 1/42* (2006.01)
*H05K 5/06* (2006.01)

(52) U.S. Cl.
CPC ............... *H01Q 1/243* (2013.01); *H01Q 1/42* (2013.01); *H05K 5/06* (2013.01)

(58) Field of Classification Search
CPC ................................. H01Q 1/243; H01Q 1/42
See application file for complete search history.

(56) References Cited

U.S. PATENT DOCUMENTS

| | | |
|---|---|---|
| 6,963,311 B1 | 11/2005 | Enns |
| 2005/0094376 A1 | 5/2005 | Montoya |
| 2007/0060214 A1 | 3/2007 | Sung et al. |
| 2008/0165078 A1 | 7/2008 | Song |
| 2009/0033571 A1 | 2/2009 | Wang |
| 2009/0131129 A1 | 5/2009 | Yamazaki et al. |
| 2009/0251372 A1 | 10/2009 | Degner et al. |
| 2010/0090926 A1 | 4/2010 | Li |
| 2018/0034163 A1 | 2/2018 | Gok et al. |
| 2019/0393591 A1* | 12/2019 | Spick ...................... H01Q 1/38 |
| 2020/0076065 A1 | 3/2020 | Zhou |

(Continued)

FOREIGN PATENT DOCUMENTS

| | | |
|---|---|---|
| CN | 101578733 A | 11/2009 |
| CN | 101697557 A | 4/2010 |

(Continued)

*Primary Examiner* — Graham P Smith
(74) *Attorney, Agent, or Firm* — Cooper Legal Group, LLC (57) ABSTRACT

An electronic device includes a casing and an antenna assembly. The casing has a waterproof area and a peripheral area. The peripheral area is defined at the periphery of the waterproof area. The antenna assembly is disposed at the peripheral area. The antenna assembly includes a housing, a circuit board, an antenna and a cover. The housing has a receiving recess. The circuit board is disposed in the receiving recess. The antenna is disposed in the receiving recess and electrically connected to the circuit board. The cover is mounted on the housing and hermetically seals the receiving recess.

20 Claims, 7 Drawing Sheets

(56) References Cited

U.S. PATENT DOCUMENTS

| | | |
|---|---|---|
| 2021/0011469 A1 | 1/2021 | Chen et al. |
| 2021/0050664 A1 | 2/2021 | Lin et al. |

FOREIGN PATENT DOCUMENTS

| | | |
|---|---|---|
| CN | 101728629 A | 6/2010 |
| CN | 103197743 A | 7/2013 |
| CN | 106527595 A | 3/2017 |
| KR | 200421716 Y1 | 7/2006 |
| TW | M327095 U | 2/2008 |

* cited by examiner

ELECTRONIC DEVICE AND ANTENNA ASSEMBLY

CROSS-REFERENCE TO RELATED APPLICATIONS

The present application is a continuation of U.S. Non-Provisional patent application Ser. No. 17/357,476, filed on Jun. 24, 2021, which claims the benefit of U.S. Provisional Patent Application No. 63/044,206, filed on Jun. 25, 2020. The disclosures of U.S. Non-Provisional patent application Ser. No. 17/357,476 and U.S. Provisional Patent Application No. 63/044,206 are hereby incorporated by reference herein in their entireties. The present application further claims priority to CN patent application Ser. No. 202011268948.7, filed on Nov. 13, 2020, the disclosure of which is also hereby incorporated by reference herein in its entirety.

BACKGROUND OF THE INVENTION

Field of the Invention

The present disclosure relates to electronic devices and antenna assemblies and, more particularly, to an electronic device and an antenna assembly with an antenna contained in a housing hermetically sealed with a cover.

Description of the Prior Art

At present, electronic devices mostly come with fourth-generation (4G) mobile communication technology antennas. 4G antennas do not need power supply and thus have little waterproofing requirement; hence, 4G antennas may be disposed at slightly-waterproof peripheral areas of casings of electronic devices to maintain efficiency of receiving and sending antenna signal. Owing to advance of communication technology, fourth-generation (4G) mobile communication technology has evolved into fifth-generation (5G) mobile communication technology. 5G has advantages as follows: high data transmission speed, reduced delay, power saving, low cost, increased system capacity, and large-scale device connection. Therefore, 5G is inevitably a technology to be applied to electronic devices in the foreseeable future.

However, 5G antennas need power supply; hence, compared with 4G antennas, 5G antennas have high waterproofing requirement and satisfactory efficiency of receiving and sending antenna signals. However, 5G antennas cannot be disposed within waterproof areas surrounded by metal plates of electronic devices, otherwise signal shielding will occur. Therefore, there is difficulty in applying 5G antennas to electronic devices.

SUMMARY OF THE INVENTION

The present disclosure provides an electronic device and an antenna assembly to overcome the aforesaid difficulty in applying 5G antennas to electronic devices.

An electronic device provided in an embodiment of the present disclosure comprises a casing and an antenna assembly. The casing has a waterproof area and a peripheral area. The peripheral area is defined at the periphery of the waterproof area. The antenna assembly is disposed at the peripheral area. The antenna assembly comprises a housing, a circuit board, an antenna and a cover. The housing has a receiving recess. The circuit board is disposed in the receiving recess. The antenna is disposed in the receiving recess and electrically connected to the circuit board. The cover is mounted on the housing and hermetically seals the receiving recess.

An antenna assembly provided in another embodiment of the present disclosure comprises a housing, a circuit board, an antenna and a cover. The housing has a receiving recess. The circuit board is disposed in the receiving recess. The antenna is disposed in the receiving recess and electrically connected to the circuit board. The cover is mounted on the housing and hermetically seals the receiving recess.

Regarding the electronic device and the antenna assembly provided in the aforesaid embodiment, the receiving recess of the housing is hermetically sealed with a cover to prevent intrusion of water and moisture into the receiving recess of the housing and thus ensure the hermetic seal of the housing. Therefore, even though the antenna assembly is disposed at the peripheral area defined at the periphery of the waterproof area of the casing, water and moisture cannot intrude into the housing, thereby lowering the chance that the antenna and circuit board in the housing will get damaged.

The description above and the description below serve to provide examples and explanations to the principles of the present disclosure and provide further interpretation to the claims of the present disclosure.

DETAILED DESCRIPTION OF THE EMBODIMENTS

Figure 1:
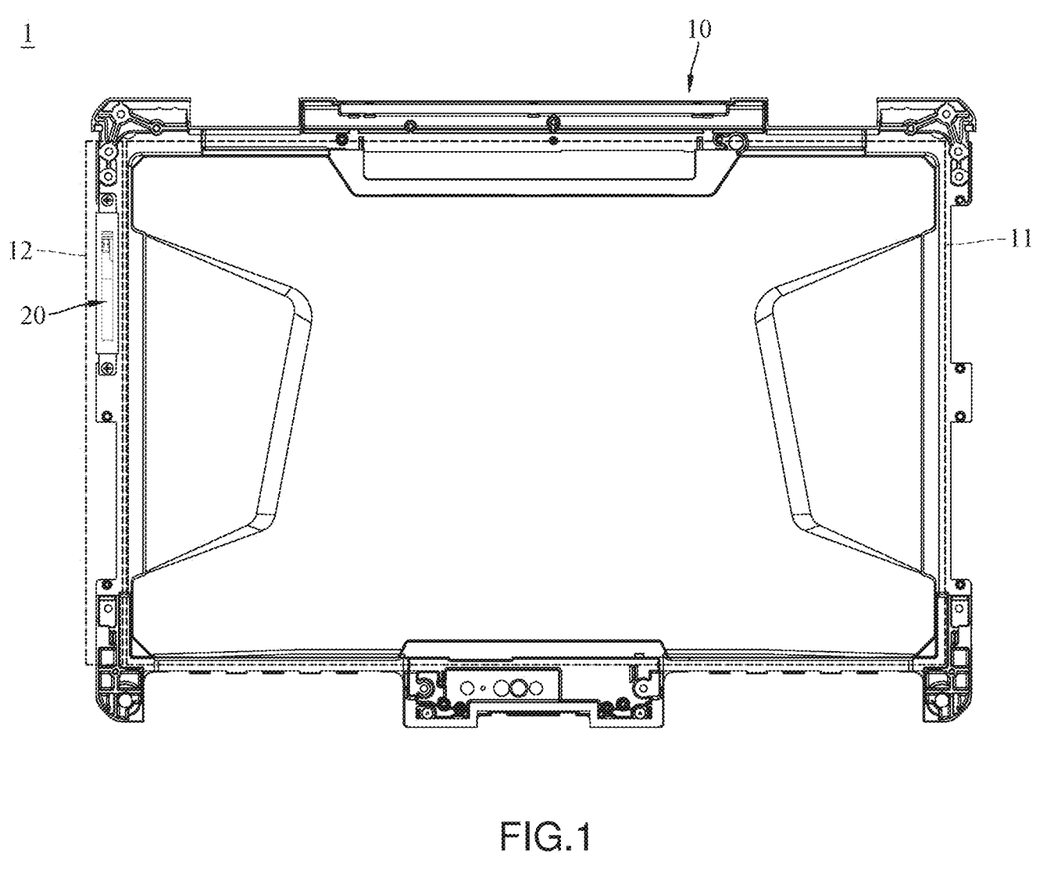
FIG. 1 is a top view of an electronic device according to the first embodiment of the present disclosure.
Figure 2:
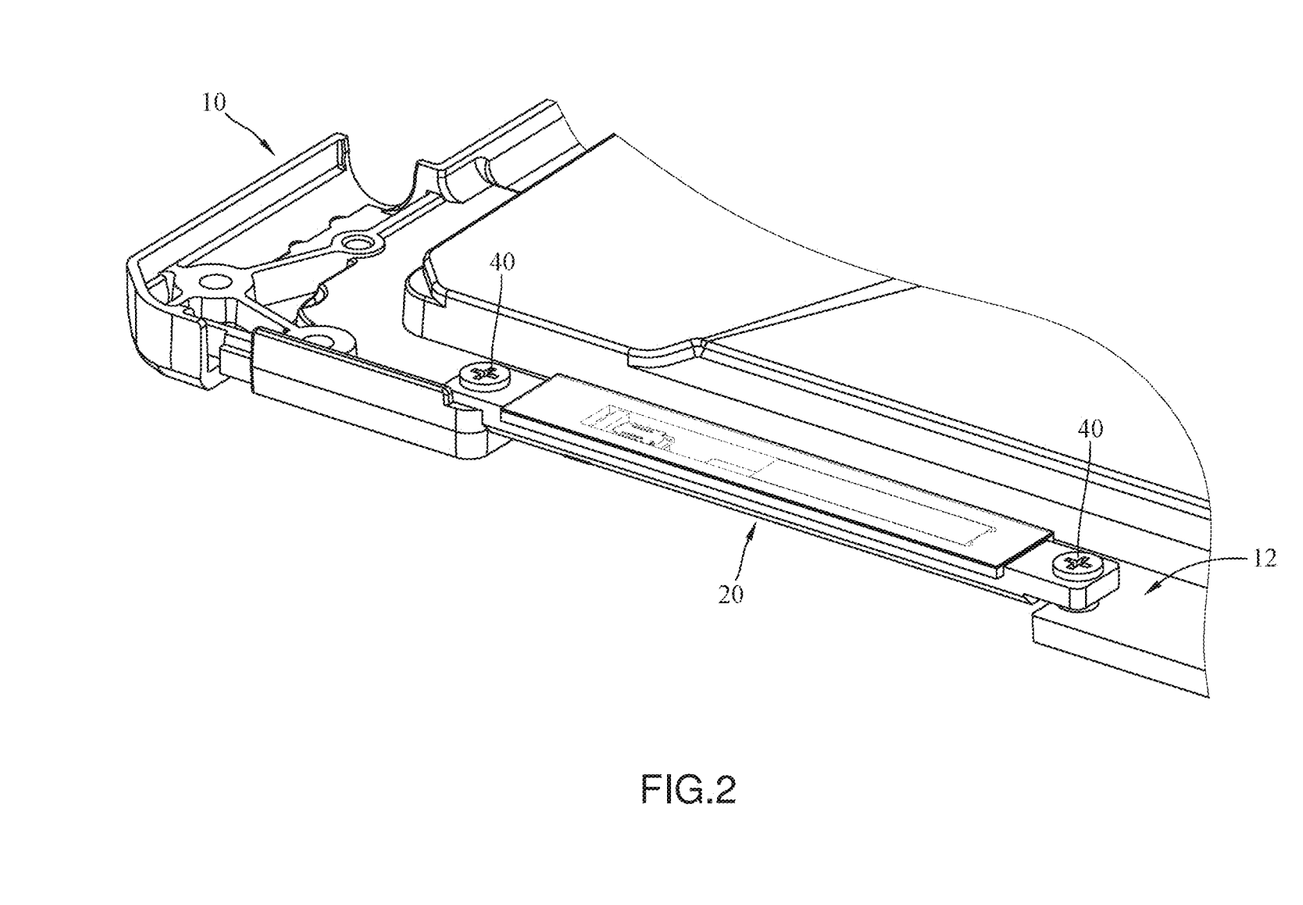
FIG. 2 is a cutaway view based on FIG. 1.
Figure 3:
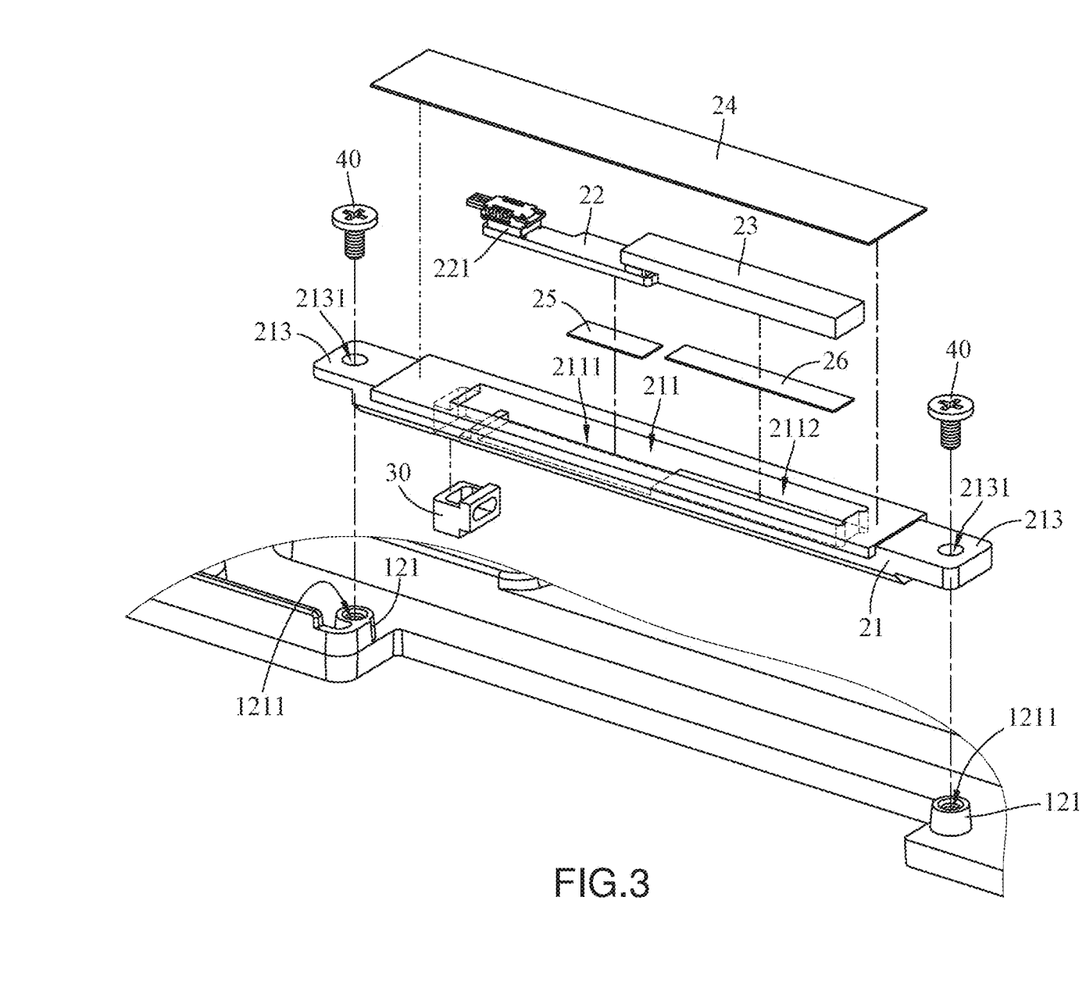
FIG. 3 is an exploded view based on FIG. 2.
Figure 4:
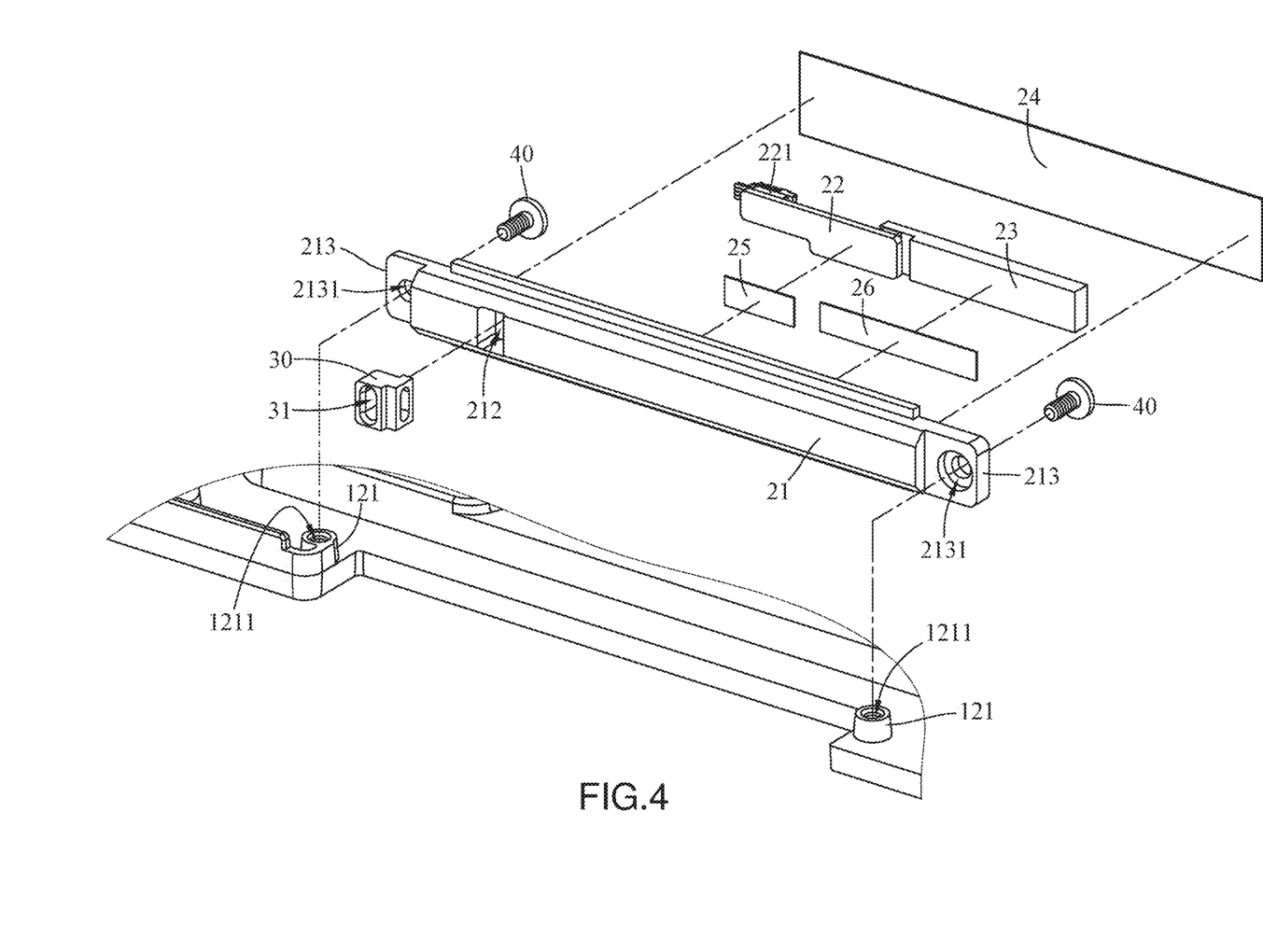
FIG. 4 is an exploded view taken from another angle and based on FIG. 2.

Refer to FIG. 1 through FIG. 3. FIG. 1 is a top view of an electronic device according to the first embodiment of the present disclosure. FIG. 2 is a cutaway view based on FIG. 1. FIG. 3 is an exploded view based on FIG. 2.

In this embodiment, an electronic device 1 is, for example, a display unit or a screen of a rugged laptop or a gaming laptop. One end of the electronic device 1 is pivotally connected to an input device, such as a keyboard. However, in a variant embodiment, the electronic device 1 is a cellphone, a tablet, or a mobile electronic apparatus without any keyboard. The electronic device 1 comprises a casing 10 and an antenna assembly 20. In this embodiment or any other embodiment, the electronic device 1 further comprises a sealing element 30 and two fastening elements 40.

Figure 5:
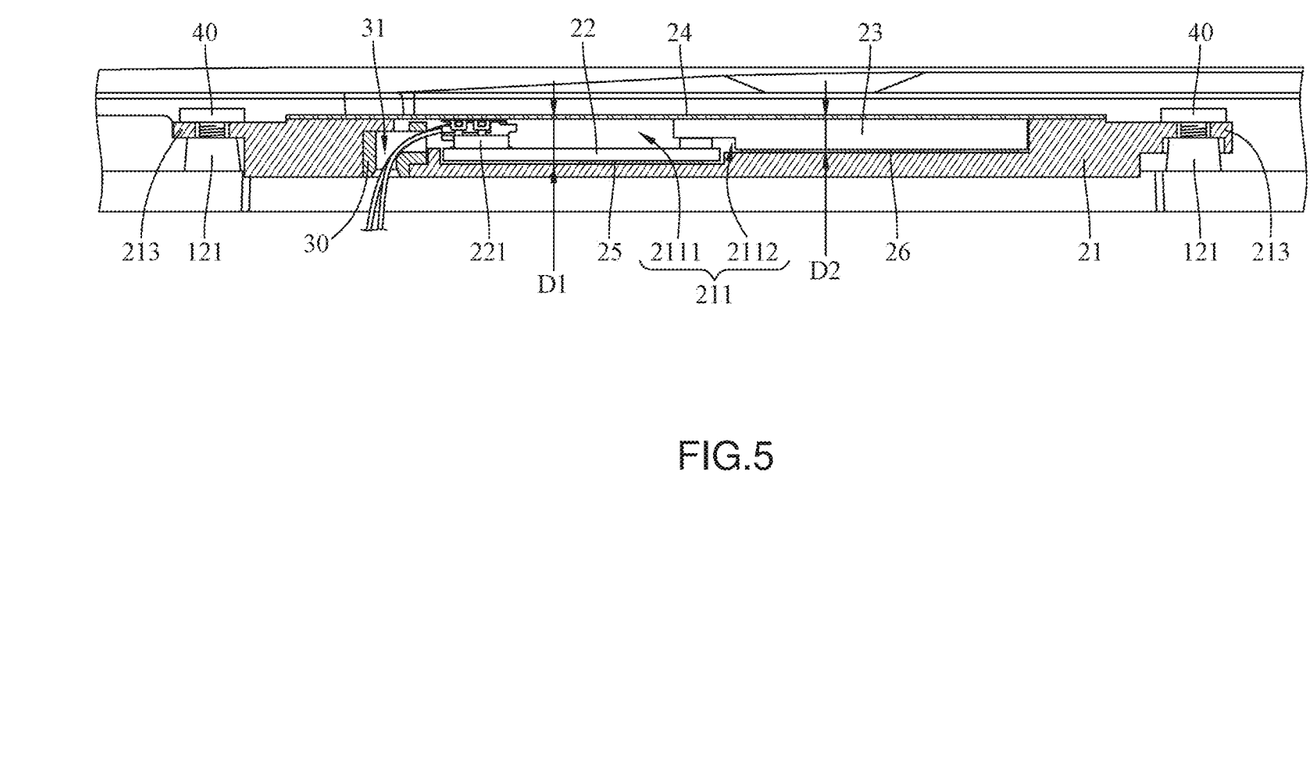
FIG. 5 is a cross-sectional view based on FIG. 2.

Referring to FIG. 2 through FIG. 5, FIG. 4 is an exploded view taken from another angle and based on FIG. 2, whereas FIG. 5 is a cross-sectional view based on FIG. 2.

The casing 10 is, for example, a housing for part of the screen of a laptop. The casing 10 has a waterproof area 11 and a peripheral area 12. The waterproof area 11 is, for example, surrounded by a metal plate. The peripheral area 12 is defined at the periphery of the waterproof area 11. The peripheral area 12 is enclosed by a plastic coating. Thus, the peripheral area 12 falls outside an area formed by the surrounding metal plate; hence, not only does the peripheral area 12 have worse waterproofing performance than the waterproof area 11, but electronic components in the peripheral area 12 are also less susceptible to signal shielding than electronic components in the waterproof area 11. Therefore, the waterproof area 11 accommodates electronic components which have to shut out water or have to be protected against electromagnetic interference, such as motherboards, whereas the peripheral area 12 accommodates electronic components which either has little waterproofing requirement or has a need to receive and send wireless signals.

The antenna assembly 20 comprises a housing 21, a circuit board 22, an antenna 23 and a cover 24. The housing 21 is, for example, a thermally conductive material. The housing 21 has a receiving recess 211. The receiving recess 211 has a first receiving segment 2111 and a second receiving segment 2112. The first receiving segment 2111 is of a depth D1. The second receiving segment 2112 is of a depth D2, where depth D1 is greater than depth D2. The circuit board 22 and the antenna 23 are, for example, adhered to the housing 21 with double-sided tape 25, 26 and thus fixed to the first receiving segment 2111 and second receiving segment 2112, respectively. The antenna 23 is, for example, 5G antenna. The antenna 23 is electrically connected to the circuit board 22 and thermally coupled to the housing 21. Heat generated by the antenna 23 is transferred to the casing 10 through the housing 21, such that heat exchange takes place between the casing 10 and the surroundings. The cover 24 is, for example, made of Mylar and is transparent. The cover 24 is, for example, adhered and thus fixed to the housing 21 so as to hermetically seal the receiving recess 211 of the housing 21, thereby preventing intrusion of water and moisture into the receiving recess 211.

In this embodiment, with the cover 24 being transparent, components (such as the circuit board 22 and the antenna 23) inside the housing 21 are visible with the naked eye, rendering it easy to determine whether the components are correctly mounted in place. Moreover, an advantage is achieved by fixing both the antenna 23 and the circuit board 22 to the housing 21 with double-sided tape and affixing the cover 24 to the housing 21, as explained below: when it is determined that the circuit board 22 and/or the antenna 23 are/is wrongly mounted in place, not only is it easy to remove the cover 24, circuit board 22 and antenna 23 from the housing 21, but subsequently it is also feasible to fix the circuit board 22, antenna 23 and cover 24 in place again by applying the double-sided tape (for fixing the circuit board 22 and antenna 23 in place) and the adhesive (for fixing the cover 24 in place) anew, thereby reducing the cost incurred in correcting mistakes of mounting the circuit board 22 and antenna 23 in place.

In this embodiment, the circuit board 22 has a power connector 221, and the housing 21 further has a wiring aperture 212. The wiring aperture 212 is in communication with the first receiving segment 2111 of the receiving recess 211 of the housing 21. The sealing element 30 is, for example, made of rubber. The sealing element 30 has a through hole 31. The through hole 31 is penetrable by a power cable, such that the power cable can be connected to the power connector 221 of the circuit board 22.

In this embodiment, the peripheral area 12 of the casing 10 has two assembly structures 121, whereas the housing 21 of the antenna assembly 20 further has two assembly portions 213. The two assembly portions 213 of the housing 21 are disposed at two opposing edges of the receiving recess 211. The two assembly structures 121, for example, have two screw holes 1211. The two assembly portions 213 each have a through hole 2131. The two fastening elements 40 are, for example, screws. The two fastening elements 40 are disposed penetratingly at the two through holes 2131 and fastened to the two screw holes 1211, respectively, such that the antenna assembly 20 is fixed to the peripheral area 12 of the casing 10.

In this embodiment, the receiving recess 211 of the housing 21 is hermetically sealed with the cover 24 to shut out water and moisture. Therefore, even though the antenna assembly 20 is disposed at the peripheral area 12 defined at the periphery of the waterproof area 11, water and moisture cannot intrude into the housing 21, thereby lowering the chance that the antenna 23 and circuit board 22 in the housing 21 will get damaged.

Furthermore, in this embodiment, a gap between the through hole 31 of the sealing element 30 and the power cable is filled with waterproof plastic to prevent intrusion of water and moisture into the receiving recess 211 of the housing 21 via the gap, thereby further ensuring that the housing 21 is hermetically sealed. However, the technical feature that the sealing element 30 is made of rubber is not restrictive of the present disclosure. In a variant embodiment, the sealing element is made of waterproof plastic.

In this embodiment, the height of the two assembly structures 121 of the peripheral area 12 of the casing 10 is adjustable as needed in order to adjust the position of the antenna assembly 20, such that the antenna assembly 20 is suitable for use with different forms of electronic devices.

Figure 6:
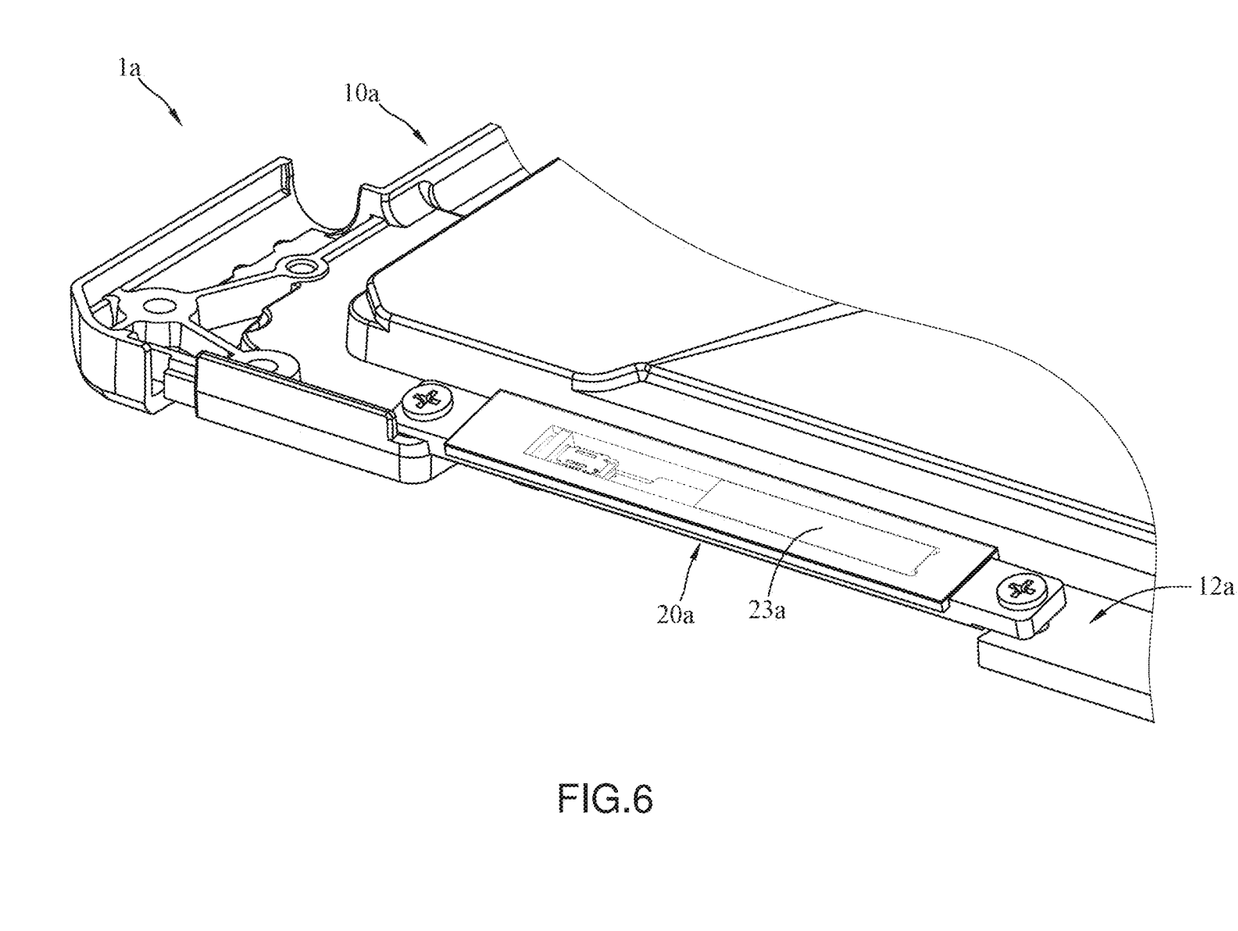
FIG. 6 is a cutaway view of the electronic device according to the second embodiment of the present disclosure.
Figure 7:
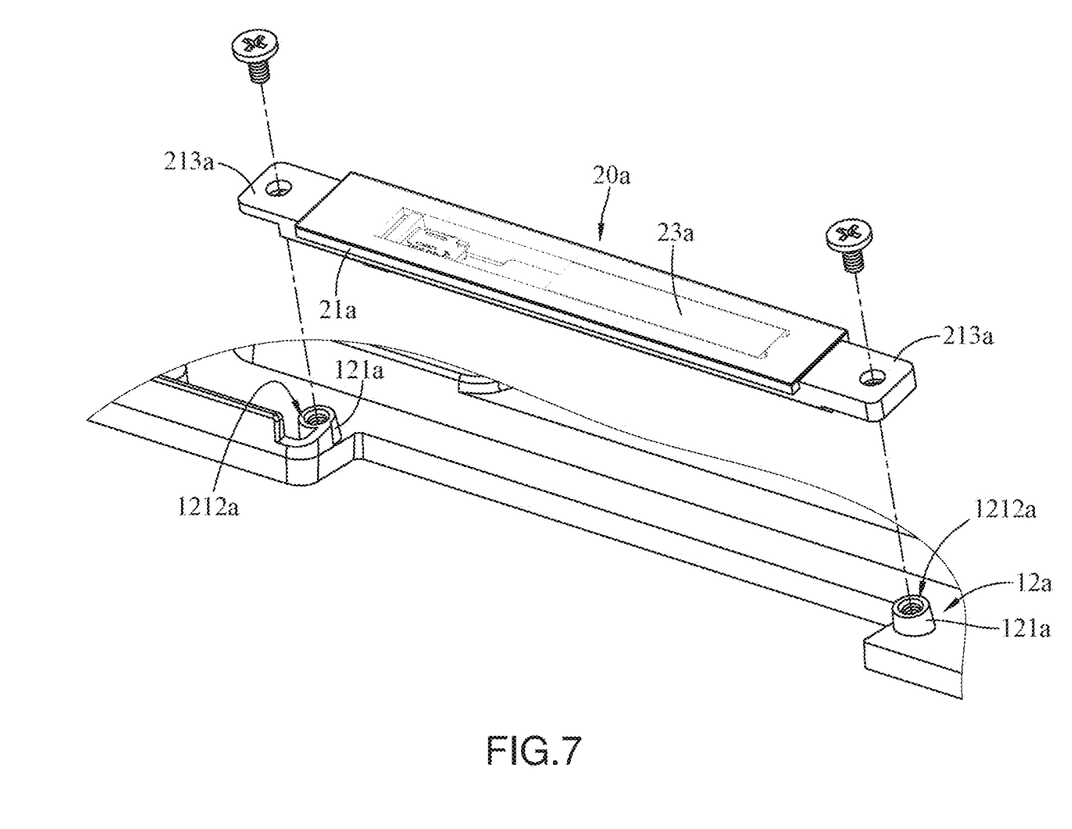
FIG. 7 is an exploded view based on FIG. 6.

Refer to FIG. 6 and FIG. 7. FIG. 6 is a cutaway view of the electronic device according to the second embodiment of the present disclosure. FIG. 7 is an exploded view based on FIG. 6.

In this embodiment, the electronic device 1a is similar to the electronic device 1 of FIG. 1. Thus, the description below focuses on differences between the electronic device 1a and the electronic device 1 of FIG. 1 rather than their common or similar technical features.

In this embodiment, the two assembly structures 121a of the peripheral area 12a of the casing 10a each have an oblique surface 1212a. Therefore, after the two assembly portions 213a of the housing 21a of the antenna assembly 20a have been stacked on and fixed to the oblique surfaces 1212a of the two assembly structures 121a, respectively, signal receiving and sending angles of the antenna 23a are different from signal receiving and sending angles of the antenna 23 of FIG. 1 and thus meet different usage needs. However, the two assembly structures 121a of the peripheral area 12a of the casing 10a do not necessarily have oblique surfaces. In a variant embodiment, assembly portions of the housing are stacked on surfaces of the assembly structures of the peripheral area of the casing, and the surfaces are horizontal and flat. Given the aforesaid arrangement, the part between the two assembly portions of the housing is rotated by an angle relative to the two assembly portions, such that the signal receiving and sending angles of the antenna are different from the signal receiving and sending angles of the antenna 23 of FIG. 1 when the two assembly portions of the housing are stacked on and fixed to the horizontal surfaces of the two assembly structures, respectively.

In the aforesaid embodiment, the housing of the antenna assembly has two assembly portions, but the present disclosure is not limited thereto. In a variant embodiment, the housing of the antenna assembly has only one assembly portion. Therefore, the housing of the antenna assembly needs only one fastening element in order to be fixed to the peripheral area of the casing.

Furthermore, in the aforesaid embodiment, the casing is exemplified by the housing of the body of a laptop, but the present disclosure is not limited thereto. In a variant embodiment, the casing is the housing of the body of a laptop.

Regarding the electronic device and the antenna assembly provided according to the aforesaid embodiments, the receiving recess of the housing is hermetically sealed with cover to prevent intrusion of water and moisture into the receiving recess of the housing. Therefore, even though the antenna assembly is disposed at the peripheral area defined at the periphery of the waterproof area, water and moisture cannot intrude into the housing, thereby lowering the chance that the antenna and circuit board in the housing will get damaged.

Although the present disclosure is disclosed above by preferred embodiments, the preferred embodiments are not restrictive of the present disclosure. Changes and modifications made by persons skilled in the art to the preferred embodiments without departing from the spirit of the present disclosure must be deemed falling within the scope of the present disclosure. Accordingly, the legal protection for the present disclosure should be defined by the appended claims.

What is claimed is:

1. An antenna assembly, comprising:
a housing having a receiving recess, wherein the receiving recess has a first receiving segment and a second receiving segment, with the first receiving segment being of greater depth than the second receiving segment;
a circuit board disposed in the receiving recess;
an antenna disposed in the receiving recess and electrically connected to the circuit board; and
a cover mounted on the housing and hermetically sealing the receiving recess, wherein the receiving recess is open at a top surface of the housing, a wiring aperture is defined through a bottom surface of the housing opposite the top surface of the housing, and the first receiving segment is disposed between the wiring aperture and the second receiving segment.

2. The antenna assembly of claim 1, further comprising:
a sealing element disposed in the wiring aperture.

3. The antenna assembly of claim 2, wherein the sealing element has a through hole extending from a first surface of the sealing element to a second surface of the sealing element perpendicular to the first surface.

4. The antenna assembly of claim 1, wherein the cover is made of biaxially oriented polyethylene terephthalate.

5. The antenna assembly of claim 1, wherein the cover is made of a transparent material.

6. The antenna assembly of claim 1, wherein the housing is made of a thermally conductive material, and the antenna is thermally coupled to the housing.

7. The antenna assembly of claim 1, wherein the circuit board comprises a power connector on a top surface of the circuit board, and the power connector is disposed between the antenna and the wiring aperture.

8. An antenna assembly, comprising:
a housing having a receiving recess, wherein the receiving recess has a first receiving segment and a second receiving segment, with the first receiving segment being of greater depth than the second receiving segment;
a circuit board disposed in the receiving recess;
an antenna disposed in the receiving recess and electrically connected to the circuit board;
a cover mounted on the housing and hermetically sealing the receiving recess, wherein a wiring aperture is defined through a bottom surface of the housing, and the first receiving segment is disposed between the wiring aperture and the second receiving segment; and
a sealing element having a through hole extending from a first surface of the sealing element to a second surface of the sealing element perpendicular to the first surface.

9. The antenna assembly of claim 8, wherein the through hole is adjacent the receiving recess such that a continuous pathway extends from the receiving recess through the through hole.

10. The antenna assembly of claim 8, wherein the sealing element is disposed in the wiring aperture.

11. The antenna assembly of claim 8, wherein the housing comprises an assembly portion having a thickness that is less than a thickness of a portion of the housing defining the receiving recess.

12. The antenna assembly of claim 11, wherein the assembly portion defines a through hole configured to receive a fastening element.

13. The antenna assembly of claim 8, wherein the cover is made of biaxially oriented polyethylene terephthalate.

14. The antenna assembly of claim 8, wherein the cover is made of a transparent material.

15. An antenna assembly, comprising:
a housing having a receiving recess, wherein the receiving recess has a first receiving segment and a second receiving segment, with the first receiving segment being of greater depth than the second receiving segment;
a circuit board disposed in the receiving recess;
an antenna disposed in the receiving recess and electrically connected to the circuit board; and
a cover mounted on the housing and hermetically sealing the receiving recess, wherein the cover is made of a transparent material, a wiring aperture is defined through a bottom surface of the housing, and the first receiving segment is disposed between the wiring aperture and the second receiving segment.

16. The antenna assembly of claim 15, wherein the cover is made of biaxially oriented polyethylene terephthalate.

17. The antenna assembly of claim 15, wherein the circuit board comprises a power connector disposed on a top surface of the circuit board facing away from a bottom of the receiving recess.

18. The antenna assembly of claim 17, wherein the wiring aperture is on a side of the receiving recess adjacent the power connector.

19. The antenna assembly of claim 1, further comprising:
a sealing element having a through hole extending from a first surface of the sealing element to a second surface of the sealing element perpendicular to the first surface.

20. The antenna assembly of claim 19, wherein the through hole is adjacent the receiving recess such that a continuous pathway extends from the receiving recess through the through hole.

* * * * *